(12) United States Patent
Hazel et al.

(10) Patent No.: US 12,055,056 B2
(45) Date of Patent: Aug. 6, 2024

(54) HYBRID SUPERALLOY ARTICLE AND METHOD OF MANUFACTURE THEREOF

(71) Applicant: RTX Corporation, Farmington, CT (US)

(72) Inventors: Brian T. Hazel, Avon, CT (US); John R. Farris, Lebanon, CT (US); Matthew A. Devore, Rocky Hill, CT (US); John A. Sharon, West Hartford, CT (US); James F. Wiedenhoefer, Windsor, CT (US); Paul M. Lutjen, Kennebunkport, ME (US); Mario P. Bochiechio, Vernon, CT (US)

(73) Assignee: RTX CORPORATION, Farmington, CT (US)

( * ) Notice: Subject to any disclaimer, the term of this patent is extended or adjusted under 35 U.S.C. 154(b) by 0 days.

(21) Appl. No.: 17/842,874

(22) Filed: Jun. 17, 2022

(65) Prior Publication Data

US 2022/0403755 A1  Dec. 22, 2022

Related U.S. Application Data

(60) Provisional application No. 63/232,958, filed on Aug. 13, 2021, provisional application No. 63/212,325, filed on Jun. 18, 2021.

(51) Int. Cl.
*F01D 25/00* (2006.01)
*B23K 20/00* (2006.01)
(Continued)

(52) U.S. Cl.
CPC .......... *F01D 25/005* (2013.01); *B23K 20/002* (2013.01); *B23K 20/02* (2013.01);
(Continued)

(58) Field of Classification Search
CPC ................. F01D 25/005; F01D 5/28
See application file for complete search history.

(56) References Cited

U.S. PATENT DOCUMENTS 3,394,918 A   7/1968   Wiseman
5,264,011 A   11/1993  Brown et al.
(Continued)

FOREIGN PATENT DOCUMENTS

DE   102014206827 A1   10/2015
EP   0744529 A1        11/1996
(Continued)

OTHER PUBLICATIONS

Extended European Search Report for EP Application No. 22179733.5; Report mail date Nov. 9, 2022 (12 pages).
(Continued)

*Primary Examiner* — Eldon T Brockman
(74) *Attorney, Agent, or Firm* — CANTOR COLBURN LLP

(57) ABSTRACT

An article comprises a first portion comprising a first alloy and a second portion comprising a second alloy that is metallurgically bonded to the first portion to form a monolithic article. The metallurgical bonding involves the application of an electrical current across the bond line and results in a retention of a metallurgical structure of the first portion and of a metallurgical structure of the second portion immediately adjacent to a bond line. The first portion has a first dominant property and the second portion has a second dominant property. The first dominant property is different from the second dominant property. The first dominant property is selected to handle operating conditions at a first position of the article where the first portion is located and
(Continued)

the second dominant property is selected to handle operating conditions at a second position of the article where the second portion is located.

21 Claims, 3 Drawing Sheets

(51) Int. Cl.
  *B23K 20/02* (2006.01)
  *F01D 11/10* (2006.01)
  *B23K 101/00* (2006.01)
  *B23K 103/08* (2006.01)

(52) U.S. Cl.
  CPC ........ *F01D 11/10* (2013.01); *B23K 2101/001* (2018.08); *B23K 2103/08* (2018.08); *F05D 2230/236* (2013.01); *F05D 2240/55* (2013.01); *F05D 2300/175* (2013.01)

(56) References Cited

U.S. PATENT DOCUMENTS

| | | | |
|---|---|---|---|
| 5,395,699 | A | 3/1995 | Ernst et al. |
| 5,636,439 | A | 6/1997 | Cunha et al. |
| 6,131,800 | A | 10/2000 | Fernihough et al. |
| 6,217,282 | B1 | 4/2001 | Stanka |
| 6,384,365 | B1 | 5/2002 | Seth et al. |
| 7,371,049 | B2 | 5/2008 | Cunha et al. |
| 7,441,331 | B2 | 10/2008 | Hudson et al. |
| 8,231,354 | B2 * | 7/2012 | Campbell ............... F01D 5/147 416/193 A |
| 8,267,663 | B2 | 9/2012 | Larose et al. |
| 8,474,137 | B2 | 7/2013 | Richter et al. |
| 9,221,101 | B2 | 12/2015 | Hugot et al. |
| 9,656,321 | B2 | 5/2017 | Cui et al. |
| 9,687,910 | B2 | 6/2017 | Bullied et al. |
| 9,700,941 | B2 | 7/2017 | James et al. |
| 9,782,862 | B2 | 10/2017 | Kamel et al. |
| 9,802,248 | B2 | 10/2017 | Marcin, Jr. et al. |
| 9,976,435 | B2 | 5/2018 | Borja et al. |
| 10,005,125 | B2 | 6/2018 | Shah et al. |
| 10,035,185 | B2 | 7/2018 | Shah et al. |
| 10,065,239 | B2 | 9/2018 | Marcin, Jr. et al. |
| 10,145,245 | B2 * | 12/2018 | Roberge ................. B23K 20/02 |
| 10,239,142 | B2 | 3/2019 | Bareiss et al. |
| 10,247,028 | B2 | 4/2019 | Blaney et al. |
| 10,287,896 | B2 | 5/2019 | Marcin, Jr. et al. |
| 10,316,683 | B2 | 6/2019 | Palmer |
| 10,449,605 | B2 | 10/2019 | Bullied et al. |
| 10,458,249 | B2 | 10/2019 | McCaffrey et al. |
| 10,584,602 | B2 | 3/2020 | Bareiss et al. |
| 10,843,271 | B2 | 11/2020 | Motin et al. |
| 11,203,064 | B2 | 12/2021 | Ozbaysal et al. |
| 2004/0134897 | A1 | 7/2004 | Das et al. |
| 2005/0091848 | A1 | 5/2005 | Nenov et al. |
| 2007/0141368 | A1 | 6/2007 | Farmer et al. |
| 2008/0166225 | A1 | 7/2008 | Strangman et al. |
| 2012/0263576 | A1 | 10/2012 | Lacy et al. |
| 2013/0205801 | A1 | 8/2013 | Ku et al. |
| 2014/0237784 | A1 | 8/2014 | Lacy et al. |
| 2014/0263579 | A1 | 9/2014 | Kulkarni et al. |
| 2014/0294652 | A1 | 10/2014 | Morrison et al. |
| 2015/0147165 | A1 | 5/2015 | Bunker |
| 2015/0345296 | A1 | 12/2015 | Davidson et al. |
| 2016/0158840 | A1 | 6/2016 | Cologna et al. |
| 2016/0186612 | A1 | 6/2016 | Anga et al. |
| 2016/0215627 | A1 * | 7/2016 | Roberge ................... F01D 5/14 |
| 2017/0333995 | A1 | 11/2017 | Ott et al. |
| 2018/0223681 | A1 | 8/2018 | Gallier et al. |
| 2019/0039133 | A1 | 2/2019 | Cui et al. |
| 2019/0054537 | A1 | 2/2019 | Mottin et al. |
| 2019/0076930 | A1 | 3/2019 | Mottin et al. |
| 2020/0215640 | A1 | 7/2020 | Sheedy et al. |
| 2020/0255345 | A1 | 8/2020 | Clark et al. |
| 2021/0254474 | A1 | 8/2021 | Farris et al. |
| 2021/0332706 | A1 | 10/2021 | Bales et al. |
| 2022/0403742 | A1 | 12/2022 | Hazel et al. |
| 2023/0147399 | A1 | 5/2023 | Farris et al. |
| 2023/0151736 | A1 | 5/2023 | Hazel et al. |
| 2023/0151738 | A1 | 5/2023 | Lutjen et al. |

FOREIGN PATENT DOCUMENTS

| | | | |
|---|---|---|---|
| EP | 1097779 | A1 | 5/2001 |
| EP | 1332824 | A2 | 8/2003 |
| EP | 1643081 | A2 | 4/2006 |
| EP | 1760265 | B1 | 3/2007 |
| EP | 2078579 | A1 | 7/2009 |
| EP | 2511482 | A2 | 10/2012 |
| EP | 2657451 | A2 | 10/2013 |
| EP | 2982471 | A1 | 2/2016 |
| EP | 3034810 | A1 | 6/2016 |
| EP | 3095971 | A1 | 11/2016 |
| EP | 3049627 | B1 | 10/2019 |
| EP | 3575016 | A1 | 12/2019 |
| EP | 3575424 | A1 | 12/2019 |
| EP | 3712122 | A1 | 9/2020 |
| EP | 3848555 | A1 | 7/2021 |
| EP | 3865664 | A1 | 8/2021 |
| FR | 2981590 | A1 | 4/2013 |
| WO | 2015023321 | A2 | 2/2015 |
| WO | 2015122953 | A2 | 8/2015 |
| WO | 2015130355 | A2 | 9/2015 |
| WO | 2021023945 | A1 | 2/2021 |

OTHER PUBLICATIONS

Extended European Search Report for EP Application No. 22179741.8; Report mail date Oct. 31, 2022 (8 pages).
Extended European Search Report for EP Application No. 22179744.2; Report mail date Oct. 31, 2022 (8 pages).
Extended European Search Report for EP Application No. 22179745.9; Report mail date Nov. 9, 2022 (13 pages).
Extended European Search Report for EP Application No. 22179758.2; Report mail date Nov. 3, 2022 (7 pages).
Extended European Search Report for EP Application No. 22179759.0; Report mail date Nov. 4, 2022 (8 pages).
Lin et al. "Sintering and joining of Ni-based superalloys via FAST for turbine disc applications" Metallurgical and Materials Transactions A, vol. 51 No. 3, pp. 1353-1366 (Mar. 2020).
Brochure: "International Workshop on Field Assisted Sintering Technology" Jun. 2017, The Pennsylvania State University, University Park, Pennsylvania (2 pages).
Lin et al.;"Solid-State Joining of Dissimilar Ni-Based Superalloys via Field-Assisted Sintering Technology for Turbine Applications"; Metallurgical and Materials Transactions A 52.6; Jun. 2021, pp. 2149-2154.
Lin, et al.: "Single Crystal Ni Superalloy Joining: Preliminary Results", Updated Nov. 9, 2020; pp. 1-20.
Walston; "Coating and Surface Technologies for Turbine Airfoils"; Superalloys 2004; TMS (The Minerals, Metals & Materials Society); Jan. 2004, pp. 579-588.
Harris et al.; "MAR M 247 Derivations—CM 247 LC DS Alloy CMSX Single Crystal Alloys Properties & Performance" The Wayback Machine; Superalloys; Jan. 1984, pp. 221-230.

\* cited by examiner

HYBRID SUPERALLOY ARTICLE AND METHOD OF MANUFACTURE THEREOF

CROSS-REFERENCE TO RELATED APPLICATIONS

This application claims the benefit of U.S. Application No. 63/232,958, filed Aug. 13, 2021, and U.S. Application No. 63/212,325 filed Jun. 18, 2021, the disclosures of which are incorporated herein by reference in their entirety.

BACKGROUND

Exemplary embodiments pertain to the art of turbine components.

Turbine hardware (e.g., blades, vanes, BOAS) are composed of single crystal (SX) superalloys. The superalloy must simultaneously achieve both the structural requirements as well as the environmental requirements of the component. This means the superalloy is inherently a compromise and not achieving either the optimal structural capability or environmental capability. Coatings can be used to augment the superalloy capabilities in locations. However, coating capability is typically affected by the underlying alloy and it may be difficult or impossible to protect some locations by coatings (e.g. turbine blade tips that are ground prior to engine assembly).

SUMMARY

An article comprises a first portion comprising a first single crystal and a second portion comprising a second single crystal that is metallurgically bonded to the first single crystal to form a monolithic article. The first portion has a first dominant property and the second portion has a second dominant property. The metallurgical bonding results in retention of a metallurgical structure of the first portion and of a metallurgical structure of the second portion immediately adjacent to a bond line after the bonding has occurred. The first dominant property is different from the second dominant property. The first dominant property is selected to handle operating conditions at a first position of the article where the first portion is located and where the second dominant property is selected to handle operating conditions at a second position of the article where the second portion is located. The article is configured to operate at stresses of greater than 200 MPa and at temperatures greater than 600° C.

In an embodiment, the first portion contacts the second portion in a spanwise direction and where the first single crystal has a first orientation while the second single crystal has a second orientation; wherein the first orientation is different from the second orientation.

In another embodiment, the first portion contacts the second portion in a circumferential direction and wherein the first single crystal has a first orientation while the second single crystal has a second orientation; wherein the first orientation is different from the second orientation.

In yet another embodiment, the first single crystal has a different composition from the second single crystal.

In yet another embodiment, the first single crystal has a same composition as the second single crystal.

In yet another embodiment, the first orientation is chosen to minimize surface stress.

In yet another embodiment, the article is a blade outer air seal and the bond line is circumferential relative to the blade outer air seal.

In yet another embodiment, the article is a turbine blade outer air seal comprising a gas path single crystal superalloy layer having a first orientation metallurgically bonded to an underlying single crystal super alloy material having a second orientation wherein the first orientation is different from the second orientation.

In yet another embodiment, the metallurgical bonding includes diffusion and creep from the first portion into the second portion and vice versa, which produces a continuation of the metallurgical structure of the first portion and a continuation of the metallurgical structure of the second portion across the bond line.

In yet another embodiment, a bond line between the first portion and the second portion is located at a region where stresses do not exceed the adhesive strength of the bond.

In yet another embodiment, the metallurgical bonding is accompanied by a lack of recrystallization in the first portion or in the second portion.

In yet another embodiment, the metallurgical bonding results in a continuation of metallurgical structure from the first portion to the second portion across the bond line.

In yet another embodiment, the metallurgical bonding is brought about by applying an electrical current across the bond line between the first portion and the second portion.

In yet another embodiment, the first single crystal and the second single crystal both comprise superalloys.

Disclosed herein too is a method of forming an article comprising bonding together a first portion and a second portion to form a monolithic article. The first portion comprises a first single crystal; and the second portion comprises a second single crystal that is metallurgically bonded to the first single crystal to form a monolithic article. The metallurgical bonding involves applying an electrical current across a bond line between first portion and second portion; wherein there is retention of a metallurgical structure of the first portion and of a metallurgical structure of the second portion immediately adjacent to the bond line after the bonding. The first portion has a first dominant property and the second portion has a second dominant property. The first dominant property is different from the second dominant property; and the first dominant property is selected to handle operating conditions at a first position of the article where the first portion is located and where the second dominant property is selected to handle operating conditions at a second position of the article where the second portion is located. A pressure may be applied across the bond line to bond the first portion to the second portion. The pressure forces the first portion onto the second portion across the bond line.

In one embodiment, the method further comprises applying pressure to the first portion and the second portion.

In another embodiment, the heating produces diffusion and creep from the first portion into the second portion and vice versa, which produces a continuation of the metallurgical structure of the first portion and a continuation of the metallurgical structure of the second portion across the bond line.

In yet another embodiment, the pressure is uniaxial pressure or radial pressure.

In yet another embodiment, the article is a turbine blade where the first portion is located at a root of the turbine blade and the second portion is located at an outer tip of a span of the turbine blade.

In yet another embodiment, the article is a blade outer air seal and the second portion contacts a gas flow path; where the first portion has a greater creep resistance than the second portion, when both are measured under the same conditions.

In yet another embodiment, the metallurgical bonding is accompanied by a lack of recrystallization in the first portion or in the second portion.

In yet another embodiment, the metallurgical bonding results in a continuation of metallurgical structure from the first portion to the second portion across the bond line.

Figure 1:
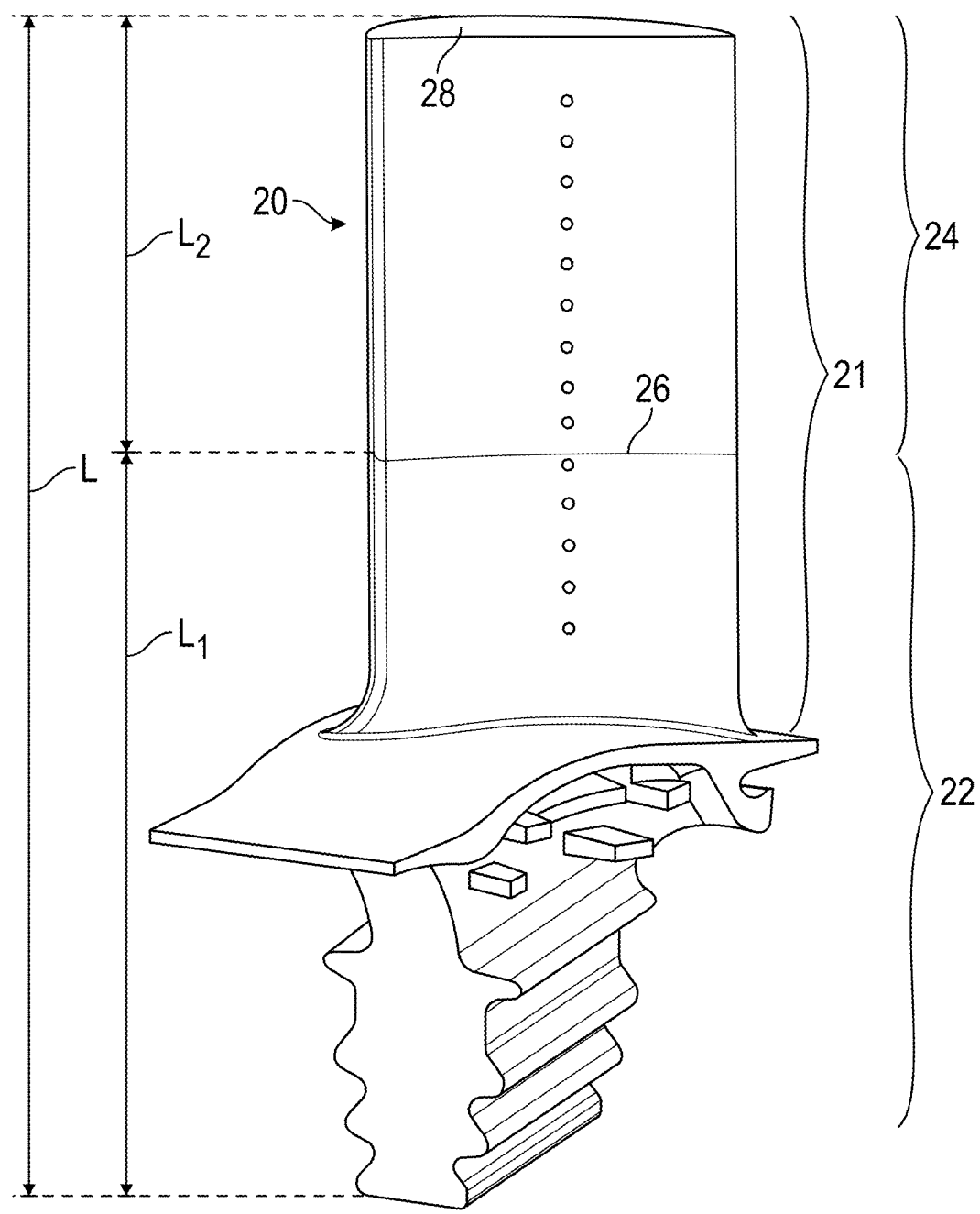
FIG. 1 depicts a turbine blade that comprises two portions bonded together to form the blade.

U.S. Provisional Application 63/212,325 filed on Jun. 18, 2021 is added hereto as Appendix A and is incorporated herein by reference.

DETAILED DESCRIPTION

Turbine section components are subjected to extreme conditions. The combustion gases pass through the turbines at extremely high temperatures. The composition of the combustion gases in combination with the high temperatures make the turbine environment extremely challenging. All components of the turbine exposed to this environment must be protected. Additionally, turbine components are subject to extreme physical stress and must be strong enough to withstand the stress at the elevated temperatures for extended periods of time. Turbine components such as turbine airfoils (blades and vanes) and blade outer air seals are typically made from superalloy materials. The superalloy materials may be chosen for environmental resistance, strength or a compromise of the two capabilities.

Disclosed herein are parts of a turbine (such as for example, blades, vanes, blade outer air seal (BOAS), or the like) that comprise two or more portions that are bonded together at a temperature lower than the melting point of each portion, where each portion has its properties selected to withstand local conditions experienced by that particular portion during operation. Disclosed herein is a part of a turbine that comprises a first alloy in a first position that is selected to handle a first set of operating conditions experienced at the first position by the article and a second alloy in a second position that is selected to handle a second set of operating conditions experienced at the second position by the article. The first set of conditions are different from the second set of conditions. In an embodiment, the first portion is selected for structural capabilities as it needs to bear large static loads (while the environmental conditions are less harsh or can be adequately addressed by a coating solution), while the second portion is selected for its environmental capabilities. In an embodiment, the first portion is located at the root of the turbine blade, while the second portion is located at the outer tip of the blade span. In an embodiment, the location of the bond line between the first and second portion is selected such that the operating conditions (mechanical and environmental) do not exceed the capability of the bond.

A turbine blade during operation experiences severe mechanical stresses and environmental hazards throughout the part. The selected superalloy defines the maximum mechanical stress and a minimum environmental resistance a given design will be capable of. The addition of one or more coatings can improve the environmental durability of the portions of the part but either reduce or provide no mechanical enhancement to the superalloy. Therefore, coatings can address some localized environmental challenges such as stress corrosion near the root, oxidation/corrosion of the airfoil, or thermal protection of the gas path surface. However, some features are challenging to adequately protect with a coating or are removed during manufacture or operation and ultimately reliant on the environmental capability of the superalloy. One such location that is challenging to protect with coatings is the outer tip (at the outer end of the span) which experiences severe environmental conditions, is difficult to protect with coatings due to operational rubbing with the blade outer air seal but has minor mechanical stresses (relative to those at the root). Design considerations would therefore dictate a turbine blade root that can withstand high mechanical stresses relative to the tip of the blade but would dictate low environmental resistance at the root relative to the tip (after available coating solutions are considered). Such varied considerations typically cannot be achieved with a single monolithic material.

Disclosed herein are turbine components that include two different metal superalloy compositions. An environmentally resistant superalloy is used where the turbine component (or a portion thereof) is exposed to the turbine environment and a high strength superalloy is used for the remainder of the turbine component. Stated another way, the turbine component includes a high strength superalloy and an environmentally resistant superalloy bonded to at least a portion of the high strength super alloy. By using the two superalloys in combination the resulting article benefits from the optimum properties of each superalloy without compromise.

In other words, two portions (a first portion and a second portion) are bonded together where the first portion has a superior first property when compared with that property for the second portion, while having an inferior second property when compared with the second portion. In other words, the second portion has a superior second property when compared with that property for the first portion. Each portion is located in an article where its dominant property handles the conditions that it is subjected to. An article can therefore be viewed as being a composite that comprises different portions where each portion is tailored specifically to handle conditions at that region of the article (e.g., that that portion is subjected to). These different portions are bonded together using Field Assisted Sintering Technology (FAST).

FAST utilizes heating below the melt point of the alloys, application of stress across the bond line to ensure contact (and may facilitate some diffusional creep at local contact points), and application of a DC electrical current through the alloys and across the bond line (the heating brought on across the bond line by the application of the DC electrical current is sometimes referred to as Joule heating). Without being limited to theory, it is believed that the DC current initiates a plasma at the bond line contact points to enhance local diffusion. Historic solid state diffusional bonding (which occurs without the use of a DC current) occur several hundreds of degrees higher than the temperatures used in FAST. The advantageous features of FAST include: 1) heating is conducted below the melt point of alloy (i.e., it is a solid state process that does not involve melting of the alloy(s)); 2) metallurgical bond occurs without use of low melt materials (as compared with brazing or TLP, which are detailed below); 3) retention of the metallurgical structure immediately adjacent the bond line (no recrystallization or melt back); and 4) continuation or near continuation of the metallurgical structure across the bond line. With regard to 3) and 4) the lack of melting during metallurgical bonding facilitates retention of the structure that existed before the process. In other words, after the FAST bonding there is a retention of a metallurgical structure of the first portion and of a metallurgical structure of the second portion immediately adjacent to a bond line from the respective metallurgical structures that existed from before the metallurgical bonding process.

The lack of any recrystallization (during FAST) prevents the formation of new grain boundaries. New grain boundaries can reduce the performance capability along the bond line. Additionally, the existence of a continuum of structure across the bond line also facilitates improved performance over the life cycle of the part. No new or additional metals are introduced into the bond line during the FAST bonding process. No new or additional alloys are formed in the bond line and in the first portion and the second portion adjacent the bond line during the FAST bonding process.

FAST is advantageous over other sources of bonding such as diffusional bonding, dual alloy casting, brazing, transient liquid phase bonding or welding under high temperature protective atmosphere. Some of the advantages of FAST over these other methods are detailed below.

Diffusional bonding does not use (is devoid of) the application of a DC current for heating that enhances bond line diffusion. It however uses a much higher temperature (than temperatures used in FAST) and a longer bonding cycle than FAST but is also conducted below the melting point of the alloy. Due to higher temperature and longer cycle there is aging of the alloys (e.g., coursing of gamma prime phase in nickel-based alloys) or detrimental feature formations (e.g., recrystallization in single crystal alloys) that are generally considered detrimental.

Dual alloy casting includes casting a first piece then remelting an interface and casting a second piece onto the molten portion of the first piece. This process is conducted above melt point of alloy as it is a method that includes casting (pouring of a molten metal).

In FAST, it is easier to locate the bond line (between the first portion and the second portion) with high precision as it relies on machining of two pieces to specific shape with little or no displacement of that contact surface thereafter. Dual casting relies on a partial fill of the first casting, remelting of the interface, and a mixing of the interface thereby making the bond line location more variable. Metallurgy of the bond line is going to be a composite of the alloys selected as they will undergo mixing in the melt or in a partially molten state. This may result in the formation of deleterious phases as a result of dissimilar alloy combinations. These deleterious phases will come out (i.e., precipitate) much more quickly and over larger zone sizes in dual alloy casting.

Brazing requires low melt alloy (in the case of nickel superalloy bonding commonly a boron or silicon enriched alloy) to be placed between two alloys to be bonded. The low melt alloy is melted and then solidified forming the joint between the two alloys. Capability of the joint is dependent on the low melt alloy which will have obviously lower temperature capability but also generally lower mechanical and environmental properties as it is selected for its melt point. It therefore compromises mechanical and environmental properties. The strength of brazed joints is generally low (typically no greater than a few kilopounds per square inch (KSI)). Brazing has a much lower performance capability than FAST or dual alloy casting.

Transient Liquid Phase (TLP) bonding is similar to brazing but uses more complex alloys (in lieu of the low melt alloy using in brazing) and uses more complete mixing during the diffusion cycle. This results in generally higher mechanical and environmental capabilities over brazing but significantly less than the individual alloys used to form the bond. TLP has a much lower expected capability than FAST or dual alloy casting.

Welding high temperature protective atmosphere (example includes superalloy welding at elevated temperature or SWET) involves welding and therefore requires melting of the alloy and consequent re-solidification. The bond line between the two alloys will be a welded feature with an equiaxed grain structure and associated weld defects (e.g., quench cracking is one common challenge). The bond line will have its own unique capability and be different than the alloys bonded. This technique (SWET) is not capable of maintaining a single crystal continuous structure and therefore is a detriment in physical and environmental properties.

In summary, FAST is advantageous over these other methods because it can retain the single crystal characteristics across the bond line and because it can facilitate retention of the structure that existed before the bonding process to retain material performance of the alloys involved and to maximize the performance across the bond line. It also results in a continuum of structure (e.g., crystalline structure) from the first portion to the second portion after the bonding process.

While most of this description is detailed to facilitate the bonding of a first portion that withstands high structural forces to a second portion that withstands harsh environmental conditions, there are other components with other desirable properties that may be bonded together too using FAST. For example, the first portion may be selected for its dominant properties one of which may include resistance to tensile forces, resistance to compression, resistance to environmental degradation, enhanced thermal resistance, enhanced thermal conductivity, electrical conductivity, elastic modulus, density, thermal barrier coating (TBC) bond capability, or the like, while the second portion may be selected for its dominant properties one of which may include resistance to tensile forces, resistance to compression, resistance to environmental degradation, enhanced thermal resistance, enhanced thermal conductivity, electrical conductivity, elastic modulus, density, thermal barrier coating (TBC) bond capability, or the like. The dominant property of the first portion will be different from the dominant property of the second portion.

While this disclosure details bonding two portions, it is to be noted that three or more portions, four or more portions may be bonded together where each portion may be tailored to handle a specific operational environment. For example, a turbine blade can be manufactured from three portions, where the dominant property of the first portion is creep resistance, the dominant property of the third portion is environmental resistance, while the second portion that is located between the first portion and the third portion displays an intermediate creep resistance and environmental resistance between that of the first portion and the second portion. The additional portion (besides the first portion and the second portion) does not always have to be located between the first and second portion and need not always have intermediate properties between those of the first portion and the second portion.

Disclosed herein too is a method of combining two different portions of an article to form the article, where each portion is selected to meet local conditions experienced by that particular portion during operation. The method comprises bonding two or more portions using a technique that involves heating the respective portions to temperatures lower than the melting point and bonding the two portions together to form a monolithic article. In an embodiment, the bonding is conducted via Field Assisted Sintering Technology (FAST) where the heating (of the two portions) is conducted using the application of an electrical current across the bond line (sometimes referred to as joule heating).

FIG. 1 depicts a typical turbine blade 20 comprising a span 21 of length L that comprises a first portion 22 and a second portion 24. The first portion 22 includes the root of the turbine blade and extends from the root to the boundary line 26 of the first portion 22, while the second portion 24 extends from the boundary line 26 to the outer tip of the span 28. The first portion 22 is manufactured from a first alloy while the second portion 24 is manufactured from a second alloy. The first portion (and hence the first alloy) 22 contacts the second portion (and hence the second alloy) 24 at the boundary line 26. In an embodiment, the first portion 22 has a length $L_1$ measured spanwise (i.e., along the span), while the second portion 24 has a length $L_2$ measured spanwise. With reference now to the FIG. 4, the boundary between the first portion of length $L_1$ and the second portion of length $L_2$ say at a point where the net section stress falls below some level, e.g., an average stress of less than 50%. FIG. 4 is a graph that depicts the net section static creep stress for a turbine blade versus percentage of span length for the turbine blade. The alloy creep stress capability is measured as per ASTM E139 (or a suitable alternative). In an embodiment, the first portion of length $L_1$ is selected to withstand stresses that are greater than 50%, preferably greater than 60% of the average static stress that the turbine blade or the BOAS is subjected to during operation. The second portion of length $L_2$ begins at the point where the stress is less than 50%, preferably less than 40% of the average stress that the turbine blade is subjected to. This stress is a static stress and therefore creep or creep-rupture is one suitable test method to assess tolerance to this type of stress.

In an embodiment, the position of the boundary (along the span) that separates the first portion from the second portion is selected such that the bond line is placed at a location so that it does not get subjected to stresses beyond its capability. In other words, the lengths $L_1$ and $L_2$ is selected so as to minimize subjecting the bond to stresses that may damage the blade. Put another way, the bond line between the first portion and the second portion is located at a region where stresses do not exceed the adhesive strength of the bond.

In an embodiment, the first alloy and the second alloy are both metal alloys that have different compositions. In an embodiment, the first and the second alloys may be superalloys. The superalloys may be single crystal, equiaxed, non-crystalline, or some combination thereof. The superalloys have substantially the same microstructure after bonding as they had prior to bonding. "Substantially the same" in this context for crystalline materials is defined as having a crystal size after bonding that is within +/−10% of the crystal size before bonding. Similarly, in the case where the superalloy is a single crystal superalloy "substantially the same" is additionally defined as having the same orientation after bonding as before bonding.

In another embodiment, the first alloy may have the same composition as the second alloy but may have a different crystalline orientation from the crystalline orientation of the second alloy. The first crystalline orientation facilitates the ability of the alloy to handle the strength requirements of the article while the second crystalline orientation facilitates the ability of the alloy to handle the environmental requirements of the article. In an embodiment, a single crystal superalloy layer having a first orientation is metallurgically bonded to an underlying single crystal super alloy material having a second orientation wherein the first orientation is different from the second orientation.

In an embodiment, the first portion comprising a single crystal superalloy layer has the same composition as the second portion that comprises the single crystal super alloy material. In another embodiment, the first portion and the second portion each comprise a single crystal that have a different composition from each other. In an embodiment, the orientation of the single crystal in the first portion is selected to minimize surface stress, while the orientation of the single crystal in the second portion is selected to minimize environmental impact on the article.

In an embodiment, the first portion contacts the second portion in a spanwise direction and where the first single crystal has a first orientation while the second single crystal has a second orientation; wherein the first orientation is different from the second orientation. In another embodiment, the first portion contacts the second portion in a circumferential direction and wherein the first single crystal has a first orientation while the second single crystal has a second orientation; wherein the first orientation is different from the second orientation.

In an embodiment, the first single crystal and the second single crystal are both superalloy crystals. In another embodiment, the first alloy may have the same composition as the second alloy but may have a different crystalline orientation from the crystalline orientation of the second alloy. The first crystalline orientation facilitates the ability of the alloy to handle the strength requirements of the article while the second crystalline orientation facilitates the ability of the alloy to handle the environmental requirements of the article.

The materials used in the first portion and the second portion are preferably alloys that have similar components but in differing amounts. For example, the first alloy and the second alloys may preferably be nickel-based superalloys, cobalt-based superalloys, or the like, or a combination thereof.

As noted above, the first alloy that is used in the first portion 22 is designed for its strength capabilities (to reduce creep), while the second alloy that is used in the second portion 24 is designed with environmental resistance in mind. In an embodiment, the first alloy used in the first portion 22 has greater mechanical properties (tensile modulus, yield strength, rupture strength, elongation to failure, resistance to creep, and the like) than the second alloy used in the second portion 24, while the second portion has a greater environmental resistance (resistance to void formation, resistance to cracking, oxidation resistance, corrosion resistance, compatibility with thermal barrier coatings to maximize spallation life, than the first portion. Property tests are conducted under the same conditions.

In an embodiment, the first alloy may be a "high strength" metal alloy. Examples of the first alloy include Alloy D, René N5, CMSX-4, CMSX-10, TMS-138 or TMS-162, whose compositions are depicted in the Table 1. Exemplary metal alloys are nickel-based metals that in addition to nickel comprise one or more of chromium, cobalt, molybdenum, aluminum, titanium, tantalum, niobium, ruthenium, rhenium, boron and carbon. The metal alloys contain one or more of the following metals in addition to nickel-2 to 10 wt % of chromium, 2 to 11 wt % of cobalt, 0.5 to 5 wt % molybdenum, 4 to 7.5 wt % of tungsten, 3-7 wt % of aluminum, 0 to 5 wt % of titanium, 3 to 10 wt % of tantalum and 2-8 wt % of rhenium. The metal alloys may also contain ruthenium, carbon and boron.

The composition of these alloys is defined to maximize mechanical properties in a single crystal form while maintaining an adequate level of environmental resistance. Table 1 and Table 2 shows exemplary ranges (of the ingredients) for the exemplary compositions (in weight percent) that may be used for the first alloy. Table 2 contains broader ranges for some of the alloys (than those indicated in Table 1) that may be used in the first portion.

in the Table 3. The cobalt to chromium ratios are lower for the metal alloys used in the second portion when compared with the metal alloys used in the first portion, while the aluminum to cobalt ratio is much higher for metal alloys used in the second portion when compared with metal alloys used in the first portion.

The second alloy used in the second portion is also a nickel-based alloy that in addition to nickel comprise one or more of chromium, cobalt, molybdenum, aluminum, titanium, tantalum, niobium, ruthenium, rhenium, boron and carbon. The metal alloys contain one or more of the following metals in addition to nickel-7 to 14 wt % of chromium, 3 to 9 wt % of cobalt, 0.1 to 0.2 wt % molybdenum, 3 to 5 wt % of tungsten, 6-9 wt % of aluminum, 0 to 5 wt % of titanium, 4 to 6 wt % of tantalum, 0.1 to 0.2 wt % f hafnium

TABLE 1

| ALLOY | COMPOSITION (WT. %) | | | | | | | | | | | | | | |
|---|---|---|---|---|---|---|---|---|---|---|---|---|---|---|---|
|  | Cr | Co | Mo | W | Al | Ti | Ta | Nb | Re | Ru | Hf | C | B | Zr | Ni |
| IN-713LC | 12 | — | 4.5 | — | 5.9 | 0.6 | — | 2 | — | — | — | 0.05 | 0.01 | 0.1 | BAL |
| IN-738LC | 16 | 8.5 | 1.75 | 2.6 | 3.4 | 3.4 | 1.75 | 0.9 | — | — | — | 0.11 | 0.01 | 0.04 | BAL |
| RENE 80 | 14 | 9 | 4 | 4 | 3 | 4.7 | — | — | — | — | 0.6 | 0.16 | 0.015 | 0.01 | BAL |
| MAR-M247 | 8 | 10 | 0.6 | 10 | 5.5 | 1 | 3 | — | — | — | 1.5 | 0.15 | 0.015 | 0.03 | BAL |
| MAR-M200HF | 8 | 9 | — | 12 | 5 | 1.9 | — | 1 | — | — | 2 | 0.13 | 0.015 | 0.03 | BAL |
| CM247LC | 8.1 | 9.2 | 0.5 | 9.5 | 5.6 | 0.7 | 3.2 | — | — | — | 1.4 | 0.07 | 0.015 | 0.007 | BAL |
| CM186LC | 6 | 9.3 | 0.6 | 6.4 | 5.7 | 0.7 | 3.4 | — | 3.0 | — | 1.4 | 0.07 | 0.015 | 0.005 | BAL |
| ALLOY A | 6.5 | 10 | 1.7 | 6.5 | 6 | — | 4 | — | 3.0 | — | 1.5 | 0.1 | 0.015 | 0.1 | BAL |
| CMSX-2 | 8 | 5 | 0.6 | 8 | 5.8 | 1 | 6 | — | — | — | — | — | — | — | BAL |
| ALLOY B | 10 | 5 | — | 4 | 5 | 1.5 | 12 | — | — | — | — | — | — | — | BAL |
| RENE N4 | 9 | 8 | 2 | 6 | 3.7 | 4.2 | 4 | 0.5 | — | — | — | — | — | — | BAL |
| AM1 | 7 | 8 | 2 | 5 | 5 | 1.8 | 8 | 1 | — | — | — | — | — | — | BAL |
| RR2000 | 10 | 15 | 3 | — | 5.5 | 4 | — | — | — | — | — | — | — | — | BAL |
| CMSX-4 | 6.5 | 9.6 | 0.6 | 6.4 | 5.6 | 1 | 6.5 | — | 3 | — | 0.1 | — | — | — | BAL |
| ALLOY C | 5 | 10 | 2 | 6 | 5.6 | — | 9 | — | 3 | — | 0.1 | — | — | — | BAL |
| RENE N5 | 7 | 8 | 2 | 5 | 6.2 | — | 7 | — | 3 | — | 0.2 | — | — | — | BAL |
| CMSX-10 | 2 | 3 | 0.4 | 5 | 5.7 | 0.2 | 8 | — | 3 | — | 0.03 | — | — | — | BAL |
| TMS-138 | 2.9 | 5.9 | 2.9 | 5.9 | 5.9 | — | 5.6 | — | 4.9 | 2 | 0.1 | — | — | — | BAL |
| TMS-162 | 2.9 | 5.8 | 3.9 | 5.8 | 5.8 | — | 5.6 | — | 4.9 | 6 | 0.09 | — | — | — | BAL |
| CMSX-7 | 6 | 10 | 0.6 | 9 | 5.7 | 0.8 | 9 | — | — | — | 0.2 | — | — | — | BAL |
| CMSX-8 | 5.4 | 10 | 0.6 | 8 | 5.7 | 0.7 | 8 | — | 1.5 | — | 0.1 | — | — | — | BAL |

TABLE 2

|  | Cr | Co | Mo | W | Al | Ti | Ta | Nb | Re | Ni |
|---|---|---|---|---|---|---|---|---|---|---|
| Alloy D | 5-7 | 9-11 | 1.5-2.5 | 5.5-7.5 | 5-7 | — | 3-10 | — | 2-4 | Balance |
| René N5 | 6-10 | 7-9 | 1.5-2.5 | 4-7 | 3-7 | 0-5 | 3-8 | 0-1 | 0-4 | Balance |
| CMSX-4 | 4-8 | 7-10 | 0.5-1.5 | 5.5-7.5 | 5-6 | 0-2 | 5-8 | — | 2-4 | balance |
| CMSX-10 | 1-3 | 2-4 | 0.1-1 | 4-6 | 5-7 | 0.1-0.4 | 6-10 | — | 4-8 | balance |
| TMS-138 | 2-4 | 3.5-6.5 | 2-4 | 5-7 | 5-7 |  | 5-7 | — | 4-6 | balance |
| TMS-162 | 2-4 | 3.5-6.5 | 3-5 | 5-7 | 5-7 |  | 5-7 | — | 5-7 | balance |

The high strength alloys used in the first portion preferably can withstand stresses of greater than 800 MPa at temperatures greater than 600° C. and stresses of greater than 200 MPa at temperatures of greater than 800° C. The article (e.g., the turbine blade and the BOAS) in which the first composition and the second composition are used are configured to operate at average tensile stresses of greater than 200 MPa and at temperatures greater than 600° C., such as, for example, an average tensile stress of greater than 500 MPa and at temperatures greater than 800° C.

The alloys used in the second portion are preferably for their ability to handle harsh environmental conditions. Exemplary alloys used in the second portion are René 195 and René N2. These compositions were developed with an eye to improved environmental resistance. This can be seen in the Al and Cr levels as compared with Re, W, Mo shown and 1-2 wt % of rhenium. The metal alloys may also contain ruthenium, carbon and boron.

TABLE 3

|  | Cr | Co | Al | Ta | Mo | W | Re | Hf | Ni |
|---|---|---|---|---|---|---|---|---|---|
| René 195 | 7-9 | 3-4 | 7-9 | 5-6 | 1-0.2 | 3-5 |  | 1-2 | 1-0.2 balance |
| René N2 | 12-14 | 7-9 | 6-8 | 4-6 |  | 3-4 |  | 1-2 | 1-0.2 balance |

The high strength alloys used in the second portion preferably can withstand stresses of at least 50% of the alloys used in the first portion at the same temperatures. In an embodiment, the high strength alloys used in the second portion are environmentally resistant and withstand temperatures of greater than 1200° C. (under oxidation conditions) while undergoing less than 0.05 grams of weight loss per unit weight.

While the FIG. 1 depicts a blade with two portions, it is possible to use three or more different alloys in three or more different portions along the span (of the blade) if desired.

Figure 2:
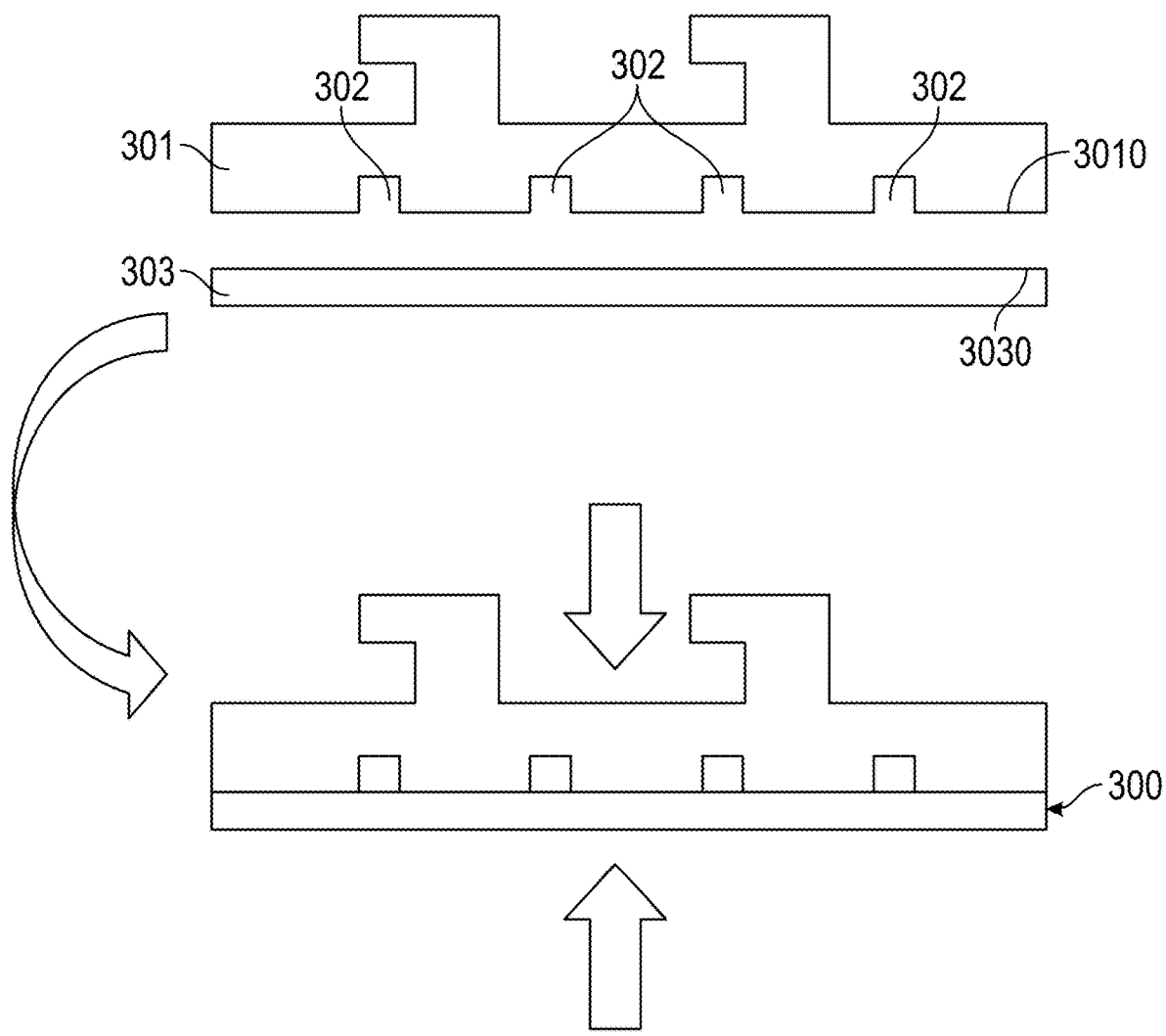
FIG. 2 depicts the bonding of two parts to form the blade outer air seal (BOAS)
Figure 3:
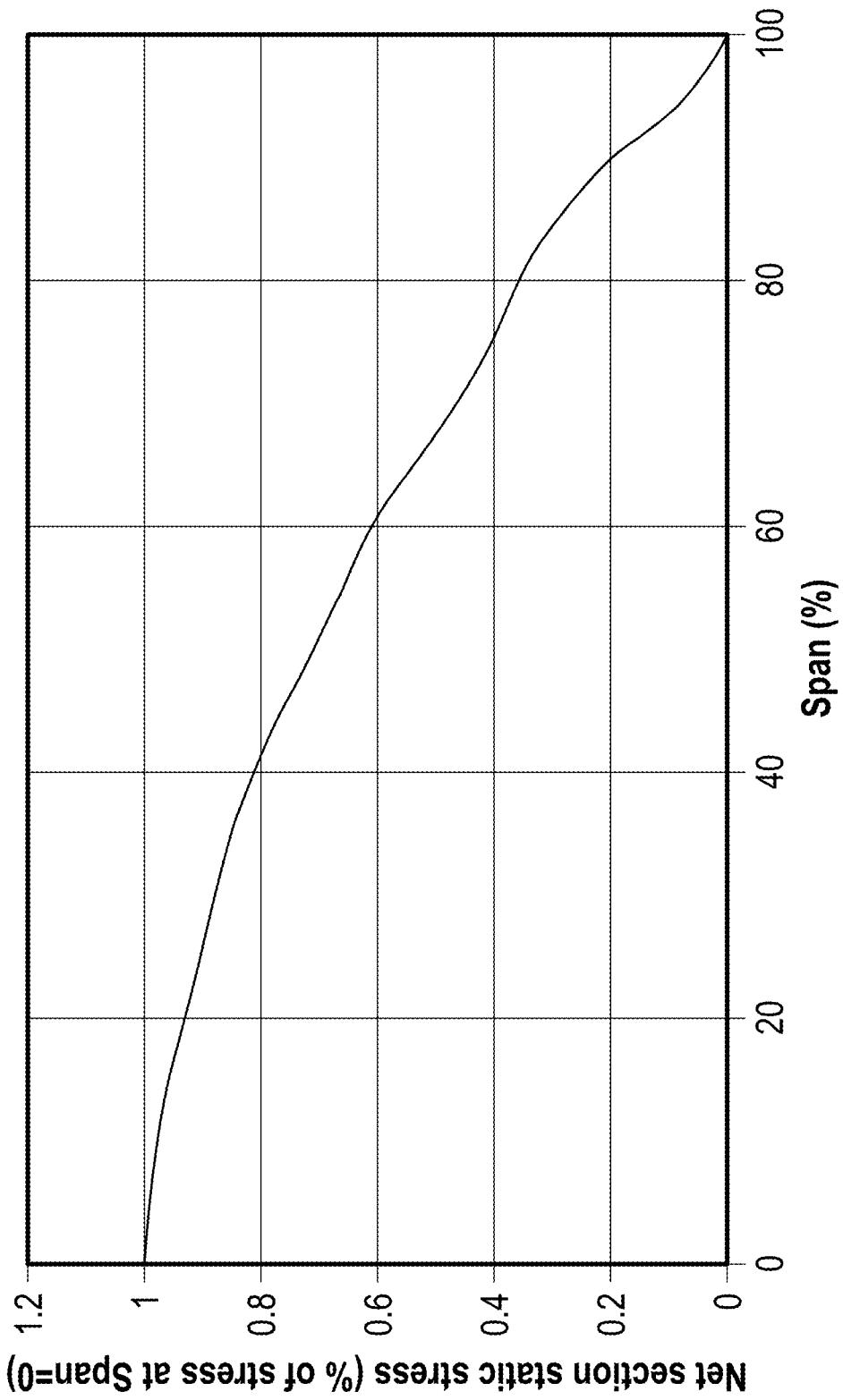
FIG. 3 is a graph that depicts the net section static creep stress for a turbine blade versus percentage of span length for a blade.

FIG. 2 depicts a method of bonding a first section 301 (same as the term "first portion") and a second section 303 (same as the term "second portion") to form the blade outer air seal (BOAS) 300. The terms "first section" and "second section" are the same as the terms "first portion" and "second portion" used in conjunction with the turbine blade of FIG. 1 but are only used in conjunction with the BOAS.

The first section 301 with passages 302 and the second section 303 are first formed by at least one of casting and machining. The passages 302 are delimited by the first section 301 and the second section 303. The metallurgical bonding of the first section 301 and the second section 303 may be preceded by surface machining and/or cleaning that provides for good contact-making bonding surfaces. In addition, recessing the passages 302 into the first section 301 from an edge 3010 of the first section 301 may be conducted at this time.

The metallurgical bonding operation can include bonding the edge 3010 of the first section 301 to a corresponding edge 3030 of the second section 303 so that each passage 302 is bordered on each side by the first section 301 or the second section 303. This metallurgical bonding of first section 301 to second section 303 is performed under pressure using an electrical current across the bond line.

As detailed above, the first alloy (used in the first section 301) may comprise the elements shown in the Table 2 shown above, while the second alloy (used in the second section 303) may comprise the elements shown in the Table 3.

In one embodiment, in one method of manufacturing the blade of the FIG. 1 or the BOAS of the FIG. 2, the first portion comprising the first alloy is cast separately from the second portion comprising the second alloy. The first portion and the second portion may be subjected to preliminary machining to arrive at the best dimensions desirable for the FAST process. The first portion and the second portion are then bonded together using the FAST process where the application of an electrical current across the bond line is used to facilitate the bonding. The FAST process is sometimes referred to as Spark Plasma Sintering (SPS). The bonding results in a diffusion of certain elements from the first portion into the second portion and vice versa.

The FAST process is a consolidation process at temperatures lower than the melting point of the materials being worked on. Similar to hot pressing, FAST forms bonds between materials but at temperatures that are about ~200° C. lower than their melting point(s). FAST utilizes a high amperage pulsed direct current (DC) electrical current to heat the materials to be bonded through the application of an electrical current across the bond line while under uniaxial compression. The consolidation is a combination of solid-state transport mechanisms including primarily diffusion and creep. The result is a metallurgical bond between the materials to be joined. Due to lower processing temperatures when compared with other consolidation methods, FAST mitigates significant grain growth. FAST can be advantageous to bond single crystal and equiaxed materials. FAST bonding enables high performance metallurgical joints that are similar to the monolithic capability of the alloys joined. In other words, the strength of the alloys at the interface 26 (See FIG. 1) (i.e., the adhesive strength) is as great or greater than the strength of the respective alloys (the cohesive strength) at regions other than the interface.

With reference now to the FIG. 1, when bonding the first portion 22 to the second portion 24, the two portions may be subjected to uniaxial pressure in the spanwise direction, with the second portion and the first portion being pressed against each other during the application of heat in the FAST process. With reference now to FIG. 2, when bonding the first section 301 to the second section 303, the two sections may be subjected to uniaxial pressure as indicated by the opposing arrows, with the second portion and the first portion being pressed against each other during the application of heat in the FAST process. In an embodiment, if the first section 301 and the second section 303 have curved surfaces they may be bonded together using radial pressure during the FAST process.

In addition to enabling the bonding of two superalloys, including two single crystal superalloys, metallurgically bonding using FAST/SPS allows for the use of single crystal superalloys, equiaxed superalloys and non-crystalline microstructures in the same component. Portions of a component may have one microstructure while other portions of the same component have a different microstructure. Examples include a single crystal superalloy metallurgically bonded to an equiaxed superalloy or the like.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodi-

What is claimed is:

1. An article comprising:
a first portion comprising a first single crystal; and
a second portion comprising a second single crystal that is metallurgically bonded to the first single crystal to form a monolithic article; where the first portion has a first dominant property and the second portion has a second dominant property; wherein there is retention of a metallurgical structure of the first portion and of a metallurgical structure of the second portion immediately adjacent to a bond line after the bonding has occurred; where the metallurgical bonding is accompanied by a lack of recrystallization in the first portion or in the second portion;
where the first dominant property is different from the second dominant property; and where first dominant property is selected to handle operating conditions at a first position of the article where the first portion is located and where the second dominant property is selected to handle operating conditions at a second position of the article where the second portion is located; where the article is configured to operate at stresses of greater than 200 MPa and at temperatures greater than 600° C.

2. The article of claim 1, where the first portion contacts the second portion in a spanwise direction and where the first single crystal has a first orientation while the second single crystal has a second orientation; wherein the first orientation is different from the second orientation.

3. The article of claim 1, wherein the first portion contacts the second portion in a circumferential direction and wherein the first single crystal has a first orientation while the second single crystal has a second orientation; wherein the first orientation is different from the second orientation.

4. The article of claim 1, where the first single crystal has a different composition from the second single crystal.

5. The article of claim 1, where the first single crystal has a same composition as the second single crystal.

6. The article of claim 1, wherein the first orientation is chosen to minimize thermo-mechanical stresses.

7. The article of claim 1, wherein the article is a blade outer air seal and the bond line is circumferential relative to the blade outer air seal.

8. The article of claim 1, wherein the article is a turbine blade outer air seal comprising a gas path single crystal superalloy layer having a first orientation metallurgically bonded to an underlying single crystal super alloy material having a second orientation wherein the first orientation is different from the second orientation.

9. The article of claim 1, where the metallurgical bonding includes diffusion from the first portion into the second portion and vice versa, which produces a continuation of the metallurgical structure of the first portion and a continuation of the metallurgical structure of the second portion across the bond line.

10. The article of claim 1, where a bond line between the first portion and the second portion is located at a region where stresses do not exceed the adhesive strength of the bond.

11. The article of claim 1, where the metallurgical bonding results in a continuation of metallurgical structure from the first portion to the second portion across the bond line.

12. The article of claim 1, where the metallurgical bonding involves the application of an electrical current across the bond line.

13. The article of claim 1, where the first single crystal and the second single crystal both comprise superalloys.

14. A method of forming an article comprising:
bonding together a first portion and a second portion to form a monolithic article; where
the first portion comprises a first single crystal; and the second portion comprises a second single crystal that is metallurgically bonded to the first single crystal to form a monolithic article; where
the metallurgical bonding involves the application of an electrical current across the bond between the first portion and the second portion; wherein there is retention of a metallurgical structure of the first portion and of a metallurgical structure of the second portion immediately adjacent to the bond line after the bonding; where the first portion has a first dominant property and the second portion has a second dominant property; where the first dominant property is different from the second dominant property; and where first dominant property is selected to handle operating conditions at a first position of the article where the first portion is located and where the second dominant property is selected to handle operating conditions at a second position of the article where the second portion is located.

15. The method of claim 14, further comprising applying pressure to the first portion and the second portion.

16. The method of claim 14, where the heating produces diffusion from the first portion into the second portion and vice versa, which produces a continuation of the metallurgical structure of the first portion and a continuation of the metallurgical structure of the second portion across the bond line.

17. The method of claim 15, where the pressure is applied by a uniaxial load.

18. The method of claim 14, where the article is a turbine blade and where the first portion is located at a root of the turbine blade and the second portion is located at an outer tip of a span of the turbine blade.

19. The method of claim 14, where the article is a blade outer air seal and where the second portion contacts a gas flow path; where the first portion has a greater creep resistance than the second portion, when both are measured under the same conditions.

20. The method of claim 14, where the metallurgical bonding is accompanied by a lack of recrystallization in the first portion or in the second portion.

21. The method of claim 14, where the metallurgical bonding results in a continuation of metallurgical structure from the first portion to the second portion across the bond line.

* * * * *